(12) United States Patent
Feng (10) Patent No.: US 10,133,379 B2
(45) Date of Patent: Nov. 20, 2018

(54) SUBSTRATE, TOUCH DISPLAY PANEL HAVING THE SAME, AND METHOD THEREOF

(71) Applicant: BOE TECHNOLOGY GROUP CO., LTD., Beijing (CN)

(72) Inventor: Jing Feng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 10 days.

(21) Appl. No.: 15/036,924

(22) PCT Filed: Dec. 10, 2015

(86) PCT No.: PCT/CN2015/096904
§ 371 (c)(1),
(2) Date: May 16, 2016

(87) PCT Pub. No.: WO2016/201926
PCT Pub. Date: Dec. 22, 2016

(65) Prior Publication Data
US 2017/0168616 A1   Jun. 15, 2017

(30) Foreign Application Priority Data

Jun. 19, 2015   (CN) .......................... 2015 1 0347549

(51) Int. Cl.
*G06F 3/041* (2006.01)
*G06F 3/045* (2006.01)
(Continued)

(52) U.S. Cl.
CPC ........ *G06F 3/0412* (2013.01); *C23C 14/0036* (2013.01); *C23C 14/083* (2013.01);
(Continued)

(58) Field of Classification Search
CPC .............................. G06F 3/044; G06F 3/0412
See application file for complete search history.

(56) References Cited

U.S. PATENT DOCUMENTS

2002/0039689 A1* 4/2002 Yusa .......................... G03F 1/32
430/5
2008/0165139 A1   7/2008 Hotelling et al.
(Continued)

FOREIGN PATENT DOCUMENTS

CN         102760001 A      10/2012
CN         102929454 A       2/2013
(Continued)

OTHER PUBLICATIONS

International Search Report & Written Opinion dated Mar. 21, 2016 regarding PCT/CN2015/096904.
(Continued)

*Primary Examiner* — Nan-Ying Yang
(74) *Attorney, Agent, or Firm* — Intellectual Valley Law, P.C.

(57) ABSTRACT

The present application discloses a substrate comprising a peripheral region, wherein the peripheral region comprises a first light blocking layer and a metal light blocking layer sequentially on a base substrate along a direction away from the base substrate.

19 Claims, 5 Drawing Sheets

(51) Int. Cl.
   *G06F 3/044* (2006.01)
   *C23C 14/00* (2006.01)
   *C23C 14/08* (2006.01)

(52) U.S. Cl.
   CPC .... *G06F 3/044* (2013.01); *G06F 2203/04103* (2013.01); *G06F 2203/04111* (2013.01)

(56) References Cited

U.S. PATENT DOCUMENTS

| | | | | |
|---|---|---|---|---|
| 2011/0227846 | A1* | 9/2011 | Imazeki | G06F 3/044 345/173 |
| 2011/0316803 | A1* | 12/2011 | Kim | G06F 3/044 345/173 |
| 2013/0038571 | A1* | 2/2013 | Ho | G06F 3/044 345/174 |
| 2013/0153393 | A1* | 6/2013 | Omote | G06F 3/044 200/600 |
| 2014/0160377 | A1* | 6/2014 | Yamagishi | G06F 3/044 349/12 |

FOREIGN PATENT DOCUMENTS

| | | |
|---|---|---|
| CN | 103049119 A | 4/2013 |
| CN | 104238826 A | 12/2014 |
| CN | 104461199 A | 3/2015 |
| CN | 104699289 A | 6/2015 |
| CN | 104898886 A | 9/2015 |
| EP | 2557487 A2 | 2/2013 |
| WO | 2015005437 A1 | 1/2015 |

OTHER PUBLICATIONS

The First Office Action in the Chinese Patent Application No. 201510347549.2, dated May 27, 2017; English translation attached.
The Second Office Action in the Chinese Patent Application No. 201510347549.2, dated Dec. 25, 2017; English translation attached.

* cited by examiner

SUBSTRATE, TOUCH DISPLAY PANEL HAVING THE SAME, AND METHOD THEREOF

CROSS-REFERENCE TO RELATED APPLICATION

This application is a national stage application under 35 U.S.C. § 371 of International Application No. PCT/CN2015/096904 filed Dec. 10, 2015, which claims priority to Chinese Patent Application No. 201510347549.2, filed Jun. 19, 2015, the contents of which are incorporated by reference in the entirety.

FIELD

The present invention relates to touch display technology, more particularly, to a substrate, a touch display panel having the same, and a manufacture method thereof.

BACKGROUND

One glass solution (OGS) is a touch display technology which reduces the thickness of display panel. One approach to OGS is sensor on lens technology. In the sensor on lens approach, an Indium Tin Oxide (ITO) layer is directly deposited on the back of the cover glass and patterned to form electrodes. A thin insulating layer is then formed on the ITO electrode layer, followed by depositing and patterning a second ITO electrode layer on the insulating layer. In this approach, the cover glass functions as both a protective glass and a touch control glass.

SUMMARY

In one aspect, the present invention provides a substrate comprising a peripheral region, wherein the peripheral region comprises a first light blocking layer and a metal light blocking layer sequentially on a base substrate along a direction away from the base substrate.

Optionally, the first light blocking layer and the metal light blocking layer are adjacent to each other.

Optionally, the substrate further comprises a planar layer on a side of the metal light blocking layer distal to the base substrate. Optionally, the metal light blocking layer and the planar layer are adjacent to each other.

Optionally, the substrate further comprises a touch control region, the touch control region comprises a plurality of first touch electrodes and a plurality of second touch electrodes intersecting but insulated from each other, each of the plurality of first touch electrodes comprises a plurality of first touch sub-electrodes, each of the plurality of second touch electrodes comprises a plurality of second touch sub-electrodes, each of the plurality of first touch sub-electrodes is directly connected to neighboring first touch sub-electrodes, each of the plurality of second touch sub-electrodes is connected to neighboring second touch sub-electrodes via a bridge, the plurality of first touch electrode is insulated from the plurality of second touch electrode by a plurality of insulating blocks.

Optionally, the substrate further comprises a planar layer on a side of the metal light blocking layer distal to the base substrate.

Optionally, the planar layer extends from the peripheral region into the touch control region by a length of around 10 μm to around 50 μm.

Optionally, the planar layer is on a same layer as the plurality of insulating blocks.

Optionally, the substrate further comprises a plurality of metal traces on a side of the planar layer distal to the base substrate, connected to the plurality of first touch electrodes and the plurality of second touch electrodes.

Optionally, the bridge is made of a metal material, and the plurality of metal traces are on a same layer as the bridge.

Optionally, the substrate further comprises a plurality of metal traces and a plurality of transparent electrode traces on a side of the planar layer distal to the base substrate.

Optionally, the bridge is made of a transparent material, and the plurality of transparent electrode traces are on a same layer as the bridge.

Optionally, the plurality of metal traces are on a different layer from the plurality of transparent electrode traces, each of the plurality of metal trace connects to each of the plurality of corresponding transparent electrode traces, the plurality of metal traces are connected to the plurality of first touch electrodes and the plurality of second touch electrodes via the plurality of corresponding transparent electrode traces.

Optionally, the metal light blocking layer comprises molybdenum or a molybdenum alloy.

Optionally, the metal light blocking layer comprises a molybdenum tantalum oxide alloy.

Optionally, the thickness of the metal light blocking layer is in the range of around 1000 Å to around 6000 Å.

Optionally, the thickness of the first light blocking layer is in the range of around 8 μm to around 18 μm.

In another aspect, the present invention provides a method of manufacturing a substrate. The method comprises forming a first light blocking layer on a peripheral region of a base substrate; and forming a metal light blocking layer on the first light blocking layer.

Optionally, the metal light blocking layer comprises a molybdenum tantalum oxide alloy, the method further comprises forming the metal light blocking layer comprising the molybdenum tantalum oxide alloy.

Optionally, the method further comprises forming a plurality of first touch electrodes and a plurality of second touch electrodes intersecting but insulated from each other on a touch control region of the base substrate; and forming a plurality of insulating blocks and a planar layer.

Optionally, each of the plurality of first touch electrodes comprises a plurality of first touch sub-electrodes, each of the plurality of second touch electrodes comprises a plurality of second touch sub-electrodes, each of the plurality of first touch sub-electrodes is directly connected to neighboring first touch sub-electrodes, each of the plurality of second touch sub-electrodes is not connected to neighboring second touch sub-electrodes; and the plurality of insulating blocks are at positions where neighboring second touch sub-electrodes disconnect from each other so that the neighboring second touch sub-electrodes are spaced apart by the plurality of insulating blocks, the planar layer is in the peripheral region and extends into the touch control region by a predetermined length.

Optionally, the planar layer is in the peripheral region and extends into the touch control region by a length of around 10 μm to 50 μm.

Optionally, the method further comprises forming a plurality of bridges and a plurality of metal traces, wherein the plurality of bridges are on the plurality of insulating blocks, connecting the neighboring second touch sub-electrodes, the plurality of metal traces are on the planar layer, connected to the plurality of first touch electrodes and the plurality of second touch electrodes.

Optionally, the method further comprises forming a plurality of transparent bridges and a plurality of transparent electrode traces, wherein the plurality of transparent bridges are on the plurality of insulating blocks, connecting the neighboring second touch sub-electrodes, the plurality of transparent electrode traces are on the planar layer, connected to the plurality of first touch electrodes and the plurality of second touch electrodes; and forming a plurality of metal trace in the peripheral region, wherein each of the plurality of metal trace corresponds to and is connected to each of the plurality of transparent electrode traces.

Optionally, the step of forming the metal light blocking layer comprises sputtering molybdenum and tantalum in an argon atmosphere and oxidizing molybdenum and tantalum with an oxygen-containing gas to form a molybdenum tantalum oxide thin film, wherein the molar ratio of argon and oxygen is in the range of 1:9 to 2:8.

Optionally, the thickness of the metal light blocking layer is in the range of around 1000 Å to around 6000 Å.

Optionally, the thickness of the first light blocking layer is in the range of around 8 to around 18 μm.

In another aspect, the present invention further provides a touch display panel comprising a display panel and the substrate as described herein or manufactured by a method as described herein.

BRIEF DESCRIPTION OF THE FIGURES

The following drawings are merely examples for illustrative purposes according to various disclosed embodiments and are not intended to limit the scope of the present invention.

DETAILED DESCRIPTION OF THE EMBODIMENTS

The disclosure will now describe more specifically with reference to the following embodiments. It is to be noted that the following descriptions of some embodiments are presented herein for purpose of illustration and description only. It is not intended to be exhaustive or to be limited to the precise form disclosed.

In forming an OGS touch display panel, light blocking material is applied to the peripheral region of the touch panel. In addition to a white light blocking layer, a black light blocking layer having a higher optical density value is applied to increase the optical density. In order to obtain satisfactory chrominance within the peripheral region in conventional OGS touch display panels, typically a relatively thick light blocking layer (including the white and black layers) is required. A thick light blocking layer creates a large segment difference between the light blocking layers and the base substrate, i.e., a steep "slope" between the peripheral region and the touch control region. In conventional touch display panels, broken lines and etch residues often occur around the slope area.

Figure 1:
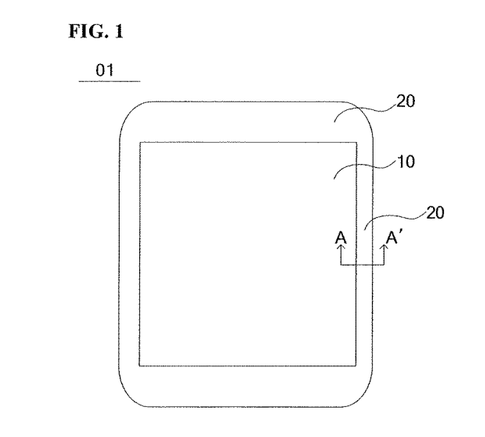
FIG. 1 is a diagram illustrating the structure of a substrate in one embodiment.

FIG. 1 is a diagram illustrating the structure of a substrate in one embodiment. Referring to FIG. 1, the substrate 01 in the embodiment includes a touch control region 10 and a peripheral region 20.

Figure 2A:
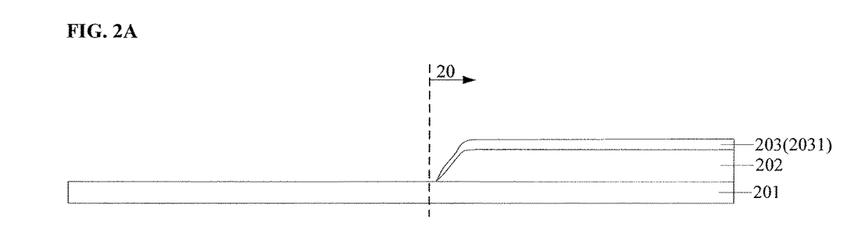
FIG. 2A is a cross-sectional view of the substrate in an embodiment taken along section line A-A' of FIG. 1.
Figure 2B:
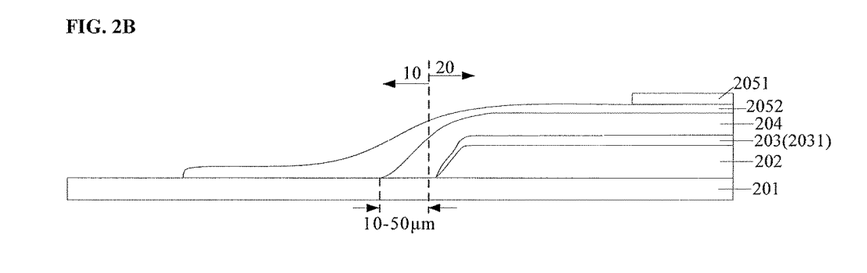
FIG. 2B is a cross-sectional view of the substrate in another embodiment taken along section line A-A' of FIG. 1.

FIG. 2A is a cross-sectional view of the substrate in an embodiment taken along section line A-A' of FIG. 1. FIG. 2B is a cross-sectional view of the substrate in another embodiment taken along section line A-A' of FIG. 1. Referring to FIGS. 2A and 2B, the peripheral regions 20 in these embodiments include a first light blocking layer 202 and a metal light blocking layer 203 on a base substrate 201 along a direction away from the base substrate 201. Optionally, the first light blocking layer 202 and the metal light blocking layer 203 are sequentially on a base substrate 201 along a direction away from the base substrate 201. Optionally, the first light blocking layer 202 and the metal light blocking layer 203 are adjacent to each other.

The base substrate 201 can be made of any suitable material such as a strengthened ITO glass. The metal light blocking layer 203 has a high reflectance and thus increases the optical density in the peripheral region 20. The first blocking layer can be made of any suitable material such as a resin. Other than blocking light, the first light blocking layer also functions as an aesthetic means hiding the metal light blocking layer 203, metal electrodes, metal traces, and other components from users. Depending on design needs, the first light blocking layer can be of any suitable color such as white, opaque, grey, silver, etc. Optionally, the first light blocking layer is a white light blocking layer.

Based on the above, the substrate 01 in some embodiments includes a touch control region 10 and a peripheral region 20. The substrate 01 includes a base substrate 201. In the peripheral region 20, the substrate 01 includes a first light blocking layer 202 for blocking light and as an aesthetic means. The substrate 01 further includes a metal light blocking layer 203 on a side of the first light blocking layer 202 distal to the base substrate 201. Because the metal light blocking layer 203 has a higher optical density, a satisfactory chrominance within the peripheral region may be obtained by including a relatively thin metal light blocking layer 203 without having to use a thick first light blocking layer 202. The total thickness of the light blocking layers can thus be decreased. Issues such as broken lines and etch residues can therefore be alleviated or avoided.

The metal light blocking layer 203 is made of a metal-containing material, and may optionally further include a non-metal material. Examples of suitable material for making the metal light blocking layer 203 include, but are not limited to, a metal, an alloy having two or more metals, a metal or alloy oxide, a metal or alloy nitride, and so on. Optionally, a metal-containing material with good thermal conductivity and low thermal expansion coefficient may be used for making the metal light blocking layer 203. Optionally, a metal-containing material which does not contaminate the base substrate 201 is used.

In some embodiments, a molybdenum-containing material is used for making the metal light blocking layer 203.

Optionally, a molybdenum-containing alloy or a molybdenum-containing compound, e.g., a molybdenum compound or a molybdenum alloy compound, is used for making the metal light blocking layer 203. Examples of molybdenum-containing materials include, but are not limited to, molybdenum metal, molybdenum alloys, molybdenum tantalum alloys, molybdenum oxides, molybdenum alloy oxides, molybdenum nitrides, molybdenum alloy nitrides, molybdenum tantalum oxide alloys, and molybdenum tantalum nitride alloys.

In some embodiments, a relatively thin layer of metal light blocking layer 203 is used. Optionally, the thickness of the metal light blocking layer 2031 can be designed to be in the range of around 1000 Å to around 6000 Å, e.g., around 1000 Å to around 2000 Å, around 2000 Å to around 3000 Å, around 3000 Å to around 4000 Å, around 4000 Å to around 5000 Å, around 5000 Å to around 6000 Å, around 1000 Å, around 2000 Å, around 3000 Å, around 4000 Å, around 5000 Å, around 6000 Å. Optionally, the thickness of the metal light blocking layer is around 3000 Å. Optionally, the metal light blocking layer 203 is a molybdenum tantalum oxide alloy blocking layer 2031.

Due to the use of a metal light blocking layer 203 such as a molybdenum tantalum oxide alloy light blocking layer 2031, it is now possible to use a thinner first blocking layer 202 without sacrificing chrominance in the peripheral region. Optionally, the thickness of the first light blocking layer is in the range of around 8 μm to around 18 μm, e.g., around 8 μm to around 10 μm, around 10 μm to around 12 μm, around 12 μm to around 14 μm, around 14 μm to around 16 μm, around 16 μm to around 18 μm, around 8 μm, around 10 μm, around 12 μm, around 14 μm, around 16 tint, around 18 μm. Optionally, the thickness of the first light blocking layer is around 10 μm.

Figure 3:
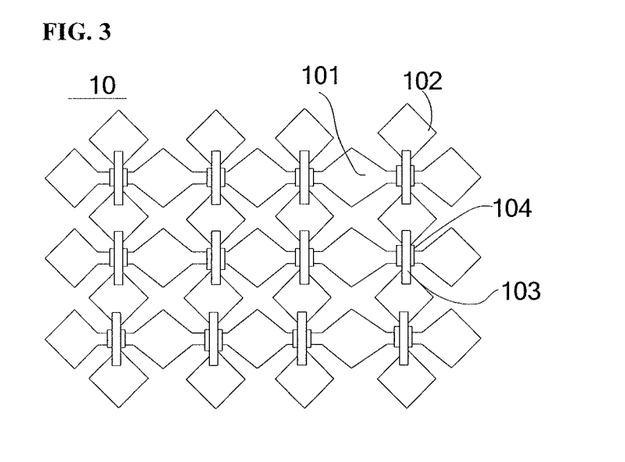
FIG. 3 is a plan view of the touch control region of a substrate in an embodiment.
Figure 4:
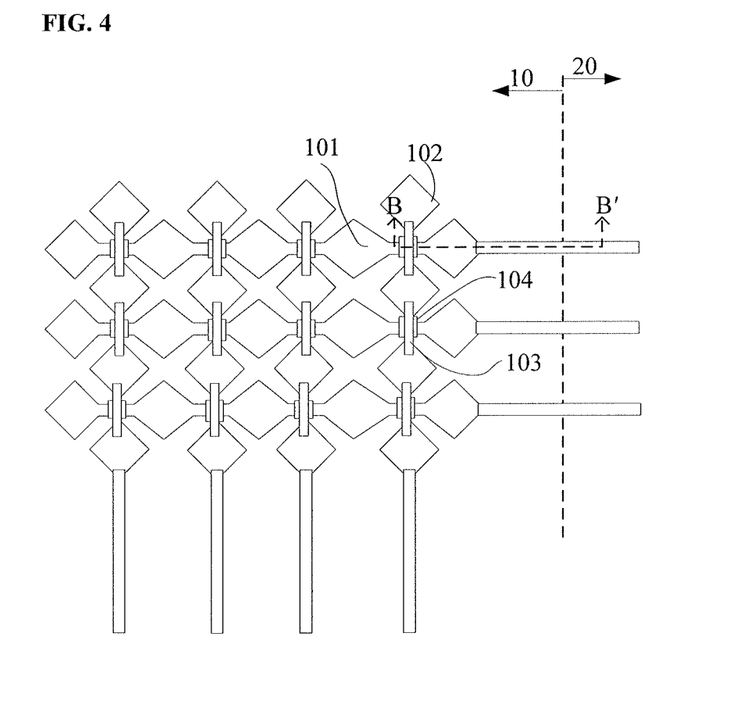
FIG. 4 is a plan view of a substrate in another embodiment.

FIG. 3 is a plan view of the touch control region of a substrate in an embodiment. FIG. 4 is a plan view of a substrate in another embodiment. Referring to FIGS. 3 and 4, the substrates 01 in these embodiments include a touch control region 10. The touch control regions 10 in the embodiments include a plurality of first touch electrodes (parallel horizontal electrode lines in FIGS. 3 and 4) and a plurality of second touch electrodes (parallel vertical electrode lines in FIGS. 3 and 4). The plurality of first touch electrodes are so arranged that the first touch electrodes are parallel to each other. The plurality of second touch electrodes are so arranged that the second touch electrodes are parallel to each other. The group of first electrodes and the group of second electrodes intersect (e.g., at a right angle) but are insulated from each other. Each of the plurality of first touch electrodes includes a plurality of first touch sub-electrodes 101. Each of the plurality of second touch electrodes includes a plurality of second touch sub-electrodes 102. As shown in FIGS. 3 and 4, each of the plurality of first touch sub-electrodes 101 is directly connected to neighboring first touch sub-electrodes 101. For example, all first sub-electrodes and connecting lines thereof may be formed in a same layer in a single patterning process and made of a same material (e.g., metal or transparent conductive material). The plurality of first touch electrodes 101 are insulated from the plurality of second touch electrode 102 by a plurality of insulating blocks 104. The second touch sub-electrodes 102 are separated and spaced apart by an insulating means, e.g., insulating blocks 104. The second touch sub-electrodes 102 may be connected by a connecting means, e.g., via a bridge 103. As shown in FIGS. 3 and 4, the second touch sub-electrodes 102 are spaced apart by the insulating blocks 104. A bridge 103 is on top of each of the insulating blocks 104, connecting neighboring second touch electrodes 102 together.

The first touch electrodes, the second touch electrodes, and the bridges 103 can be made of a non-transparent conductive material or a transparent conductive material (e.g., ITO). The first touch sub-electrodes 101 and the second touch sub-electrodes 102 can be in a same layer, optionally formed by a single patterning process.

Figure 5A:
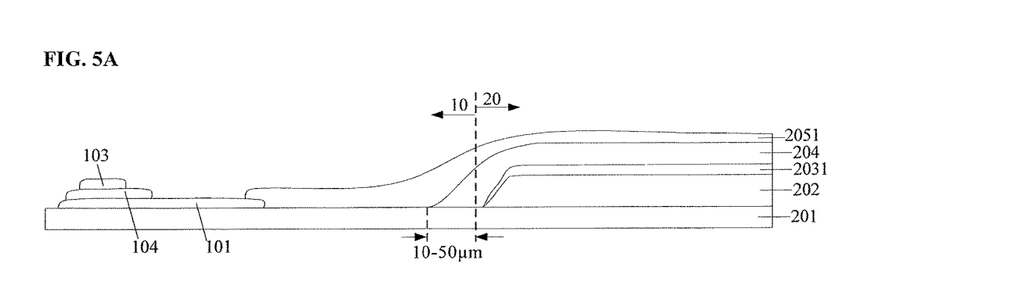
FIG. 5A is a cross-sectional view of the substrate in an embodiment taken along section line B-B' of FIG. 4.
Figure 5B:
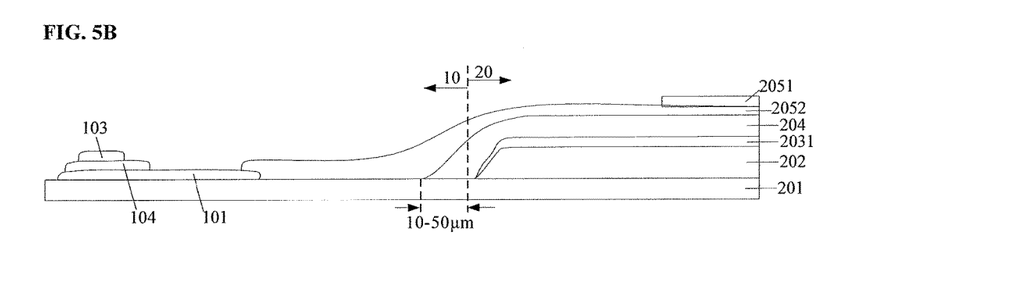
FIG. 5B is a cross-sectional view of the substrate in another embodiment taken along section line B-B' of FIG. 4.

FIG. 5A is a cross-sectional view of the substrate in an embodiment taken along section line B-B' of FIG. 4. FIG. 5B is a cross-sectional view of the substrate in another embodiment taken along section line B-B' of FIG. 4. Referring to FIGS. 5A and 5B, the substrates 01 in the embodiments further include a planar layer 204 on a side of the metal light blocking layer 203 distal to the base substrate 201. Optionally, the first light blocking layer 202, the metal light blocking layer 203, and the planar layer 204 are sequentially on the base substrate along a direction away from the base substrate. Optionally, the first light blocking layer 202 and the metal light blocking layer 203 are adjacent to each other. Optionally, the planar layer 204 and the metal light blocking layer 203 are adjacent to each other. Optionally, the first light blocking layer 202, the metal light blocking layer 203, and the planar layer 204 are adjacent to each other. The planar layer 204 is mostly within the peripheral region 20, but extends from the peripheral region 20 into the touch control region 10 by a certain length sufficient to reduce the segment difference at the interface of the touch control region 10 and the peripheral region 20. In some embodiments, the planar layer 204 extends from the peripheral region 20 into the touch control region 10 by a length of around 10 μm to around 50 μm, e.g., around 10 μm to around 20 μm, around 20 μm to around 30 μm, around 30 μm to around 40 μm, around 40 μm to around 50 pin, around 10 μm, around 20 μm, around 30 μm, around 40 μm, around 50 μm. Optionally, the planar layer 204 may extend further into the touch control region 10 (e.g., by a length of more than 50 μm) as long as it does not significantly overlap with the touch electrodes so as to affect the touch control quality.

Optionally, the thickness of the planar layer 204 is in the range of around 1.0 μm to around 2.0 μm, e.g., around 1.0 μm to around 1.5 μm, around 1.5 μm to around 2.0 μm, around 1.0 μm, around 1.5 μm, around 2.0 μm.

In some embodiments, the planar layer 204 functions as a layer insulating the metal light blocking layer 203 from metal traces and other types of electrodes on the metal light blocking layer 203. Optionally, the planar layer 204 is made of an insulating material such as a resin. Optionally, the planar layer 204 is made of an organic photosensitive resin material, e.g., an organic photoresist material. Depending on design needs, the planar layer 204 may be on a same layer as, or a different layer from, the insulating blocks 104. In some embodiments, the planar layer 204 is on a same layer as the insulating blocks 104. Optionally, the planar layer 204 and the plurality of insulating blocks 104 can be formed by a single patterning process.

Referring to FIG. 4 and FIG. 5A, the substrate 01 in the embodiment further includes a metal trace 2051 on a side of the planar layer 204 distal to the base substrate 201. The metal trace 2051 connects to the plurality of first touch electrodes and the plurality of second touch electrodes. Depending on design needs, the metal trace 2051 may be on a same layer as, or a different layer from, the bridge 103. In some embodiments, the metal trace 2051 is on a same layer as the bridge 103, and both the metal trace 2051 and the bridge 103 are made of a metal material. Optionally, the metal trace 2051 and a plurality of bridges 103 can be formed by a single patterning process.

Referring to FIG. 4 and FIG. 5B, the substrate 01 in the embodiment further includes a metal trace 2051 and a transparent electrode trace 2052 on a side of the planar layer 204 distal to the base substrate 201. Each metal trace 2051 corresponds and connects to each corresponding transparent electrode trace 2052, which in turn connects to the plurality of first touch electrodes and the plurality of second touch electrodes. Depending on design needs, the transparent electrode trace 2052 may be on a same layer as, or a different layer from, the bridge 103. In some embodiments, the transparent electrode trace 2052 is on a same layer as the bridge 103, and both the transparent electrode trace 2052 and the bridge 103 are made of transparent material. Optionally, the transparent electrode trace 2052 and a plurality of bridges 103 can be formed by a single patterning process. By using a transparent bridge 103 and a transparent electrode 2052, the aperture ratio of the touch display panel can be increased.

In some embodiments, the substrate 01 further includes a protective layer on a side of the metal trace 2051 or the transparent electrode trace 2052 distal to the base substrate 201. The protective layer protects the metal trace 2051 or the transparent electrode trace 2052 from short circuiting with other conductive materials.

The present disclosure also provides a touch control display panel comprising the substrate 01 described herein and a display panel. The display panel can be of any suitable types, e.g., a liquid crystal display panel or an organic light emitting diode display panel. When the display panel is a liquid crystal display panel, the array substrate of the display panel may include a thin film transistor, a pixel electrode connected to the drain electrode of the thin film transistor, and a common electrode. In an in-plane switch (IPS) array substrate, the pixel electrode and the common electrode may be both rod-shape electrodes, spaced apart on a same layer. In an advanced super-dimensional switching (ADS) array substrate, the pixel electrode and the common electrode may be on different layers, with a plate-like electrodes on the bottom and the rod-shape electrodes on the top. In some embodiments, the display panel further includes a color filter substrate.

When the display panel is an organic light emitting diode (OLED) display panel, the display panel may include a thin film transistor, an anode connected to the drain electrode of the thin film transistor, a cathode and an organic material functional layers. The organic material functional layers may include one or more of a light emitting layer, an electron transport layer, a hole transport layer, an electron injection layer between the cathode and the electron transport layer, and a hole injection layer between the anode and the hole transport layer. In some embodiments, the display panel further includes an encapsulating layer, e.g., a thin film encapsulating layer or a substrate encapsulating layer.

Figure 6:
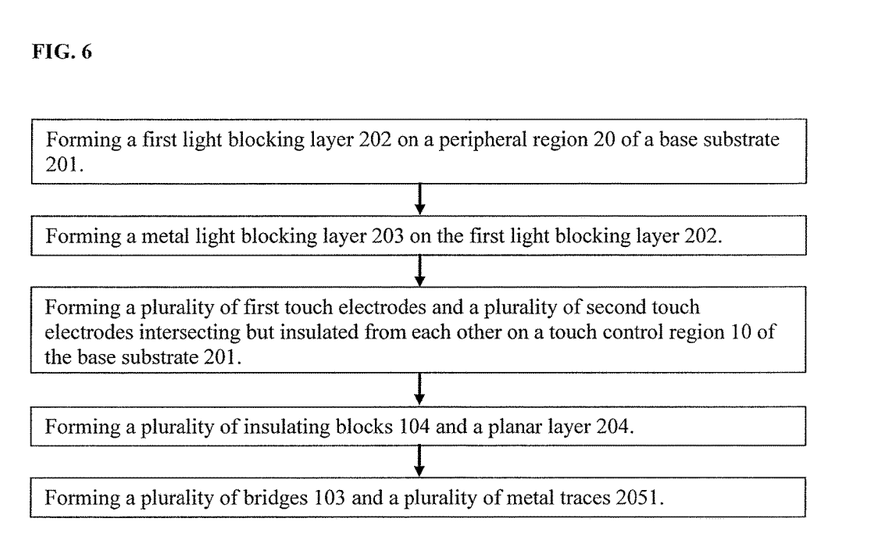
FIG. 6 is a flow chart showing a method of manufacturing a substrate in an embodiment.

FIG. 6 is a flow chart showing a method of manufacturing a substrate in an embodiment. Referring to FIG. 6, the method in the embodiment includes:

forming a first light blocking layer 202 on a peripheral region 20 of a base substrate 201;

forming a metal light blocking layer 203 on the first light blocking layer 202; and forming a plurality of first touch electrodes and a plurality of second touch electrodes intersecting but insulated from each other on a touch control region 10 of the base substrate 201.

In some embodiments, each of the plurality of first touch electrodes includes a plurality of first touch sub-electrodes 101. Each of the plurality of second touch electrodes includes a plurality of second touch sub-electrodes 102. Optionally, each of the plurality of first touch sub-electrodes 101 is directly connected to neighboring first touch sub-electrodes 101. Optionally, each of the plurality of second touch sub-electrodes 102 is not connected to neighboring second touch sub-electrodes 102.

The method in the embodiment exemplified in FIG. 6 further includes forming a plurality of insulating blocks 104 and a planar layer 204.

In some embodiments, the plurality of insulating blocks 104 are at positions where neighboring second touch sub-electrodes 102 disconnect from each other so that the touch sub-electrodes 102 are spaced apart by the insulating blocks 104. Optionally, the planar layer 204 is in the peripheral region 20 and extends into the touch control region 10 by a certain length sufficient to reduce the segment difference at the interface of the touch control region 10 and the peripheral region 20.

The method in the embodiment exemplified in FIG. 6 further includes forming a plurality of bridges 103 and a plurality of metal traces 2051.

In some embodiments, the plurality of bridges 103 are on the plurality of insulating blocks 104, connecting the neighboring second touch sub-electrodes 102. Optionally, the plurality of metal traces 2051 are on the planar layer 204, connecting to the plurality of first touch electrodes and the plurality of second touch electrodes.

Figure 7:
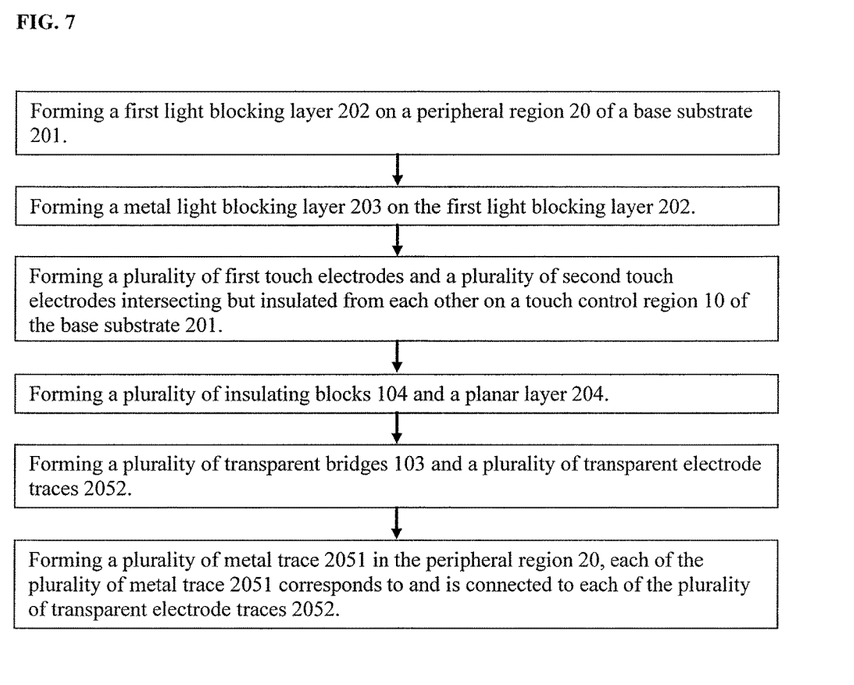
FIG. 7 is a flow chart showing a method of manufacturing a substrate in another embodiment.

FIG. 7 is a flow chart showing a method of manufacturing a substrate in another embodiment. Referring to FIG. 7, the method in the embodiment includes:

forming a first light blocking layer 202 on a peripheral region 20 of a base substrate 201, forming a metal light blocking layer 203 on the first light blocking layer 202; and forming a plurality of first touch electrodes and a plurality of second touch electrodes intersecting but insulated from each other on a touch control region 10 of the base substrate 201.

In some embodiments, each of the plurality of first touch electrodes includes a plurality of first touch sub-electrodes 101, each of the plurality of second touch electrodes comprises a plurality of second touch sub-electrodes 102. Optionally, each of the plurality of first touch sub-electrodes 101 is directly connected to neighboring first touch sub-electrodes 101. Optionally, each of the plurality of second touch sub-electrodes 102 is not connected to neighboring second touch sub-electrodes 102.

The method in the embodiment exemplified in FIG. 7 further includes forming a plurality of insulating blocks 104 and a planar layer 204.

In some embodiments, the plurality of insulating blocks 104 are at positions where neighboring second touch sub-electrodes 102 disconnect from each other so that the touch sub-electrodes 102 are spaced apart by the insulating blocks 104. Optionally, the planar layer 204 is in the peripheral region 20 and extends into the touch control region 10 by a certain length sufficient to reduce the segment difference at the interface of the touch control region 10 and the peripheral region 20.

The method in the embodiment exemplified in FIG. 7 further includes forming a plurality of transparent bridges 103 and a plurality of transparent electrode traces 2052.

In some embodiments, the plurality of transparent bridges 103 are on the plurality of insulating blocks 104, connecting the neighboring second touch sub-electrodes 102. Optionally, the plurality of transparent electrode traces 2052 are on the planar layer 204, connecting to the plurality of first touch electrodes and the plurality of second touch electrodes.

The method in the embodiment exemplified in FIG. 7 further includes forming a plurality of metal trace 2051 in the peripheral region 20, each of the plurality of metal trace 2051 corresponds to and is connected to each of the plurality of transparent electrode traces 2052.

In some embodiments, a molybdenum-containing material is used for making the metal light blocking layer 203. Optionally, a molybdenum-containing alloy is used for making the metal light blocking layer 203. Optionally, a molybdenum-containing compound, e.g., a molybdenum compound or a molybdenum alloy compound, is used for making the metal light blocking layer 203. Examples of suitable molybdenum-containing materials for making the metal light blocking layer 203 include, but are not limited to, molybdenum metal, molybdenum alloys, molybdenum tantalum alloys, molybdenum oxides, molybdenum alloy oxides, molybdenum nitrides, molybdenum alloy nitrides, molybdenum tantalum oxide alloys, and molybdenum tantalum nitride alloys.

Optionally, the thickness of the metal light blocking layer 2031 can be designed to be in the range of around 1000 Å to around 6000 Å, e.g., around 1000 Å to around 2000 Å, around 2000 Å to around 3000 Å, around 3000 Å to around 4000 Å, around 4000 Å to around 5000 Å, around 5000 Å to around 6000 Å, around 1000 Å, around 2000 Å, around 3000 Å, around 4000 Å, around 5000 Å, around 6000 Å. Optionally, the thickness of the metal light blocking layer is around 3000 Å. Optionally, the metal light blocking layer 203 is a molybdenum tantalum oxide alloy blocking layer 2031.

In some embodiments, the step of forming the metal light blocking layer comprises sputtering molybdenum and tantalum in an argon atmosphere and oxidizing molybdenum and tantalum with an oxygen-containing gas to form a molybdenum tantalum oxide thin film. Optionally, the molar ratio of argon and oxygen is in the range of 1:9 to 2:8. Optionally, the volume ratio of argon and oxygen is in the range of 1:9 to 2:8.

In some embodiments, the planar layer 204 extends from the peripheral region 20 into the touch control region 10 by a length of around 10 µm to around 50 µm, e.g., around 10 µm to around 20 µm, around 20 µm to around 30 µm, around 30 µm to around 40 µm, around 40 µm to around 50 µm, around 10 µm, around 20 µm, around 30 µm, around 40 µm, around 50 µm. Optionally, the planar layer 204 may extend further into the touch control region 10 (e.g., by a length of more than 50 µm) as long as it does not significantly overlap with the touch electrodes so as to affect the touch control quality.

Optionally, the thickness of the planar layer 204 is in the range of around 1.0 µm to around 2.0 µm, e.g., around 1.0 µm to around 1.5 µm, around 1.5 µm to around 2.0 µm, around 1.0 µm, around 1.5 µm, around 2.0 µm.

Optionally, the thickness of the first light blocking layer is in the range of around 8 µm to around 18 µm, e.g., around 8 µm to around 10 µm, around 10 µm to around 12 µm, around 12 µm to around 14 µm, around 14 µm to around 16 µm, around 16 µm to around 18 µm, around 8 µm, around 10 µm, around 12 µm, around 14 µm, around 16 µm, around 18 µm. Optionally, the thickness of the first light blocking layer is around 10 µm.

Optionally, the method further includes forming a protective layer on a side of the metal trace 2051 or the transparent electrode trace 2052 distal to the base substrate 201. The protective layer protects the metal trace 2051 or the transparent electrode trace 2052 from short circuiting with other conductive materials.

In some embodiments, wherever possible, the step of forming various components (e.g., forming metal traces, metal light blocking layer, bridges, insulating blocks, touch electrodes, transparent electrode traces, and so on) can be performed by one or more processes selected from the group consisting of printing, stamping, depositing, and patterning. Optionally, one or more forming steps are performed by a patterning process, e.g., a single patterning process. For example, a photoresist may be formed on a layer and a mask having a predetermined pattern may be placed on the photoresist layer, followed by UV exposure, development, baking and etching, thereby forming a layer having the desired components. Optionally, the forming is performed by a photolithographic process. For example, when the first light blocking layer is made of a resin material, the first light blocking layer can be formed by a photolithographic process.

The method steps as described herein are not necessarily performed sequentially, and in general can be performed in parallel with each other wherever possible.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A touch display panel comprising a display panel and a touch substrate;
wherein the touch substrate comprises:
a base substrate;
a first light blocking layer on a side of the base substrate facing the display panel and in a peripheral region of the touch substrate;
a metal light blocking layer on a side of the first light blocking layer facing away the base substrate and on a side of the first light blocking layer facing the display panel, and in the peripheral region; and
a plurality of metal traces respectively connected to a plurality of touch electrodes on the substrate, the plurality of metal traces being on a side of the metal light blocking layer facing away the first light blocking layer and on a side of the metal light blocking layer facing the display panel;
wherein the display panel comprises a first substrate and a second substrate facing each other, the first substrate being on a side of the second substrate facing away the touch substrate;
wherein the metal light blocking layer is on a side of the first light blocking layer facing the second substrate of the display panel; and
the plurality of metal traces are on a side of the metal light blocking layer facing the second substrate of the display panel.

2. The touch display panel of claim 1, wherein the first light blocking layer and the metal light blocking layer are adjacent to each other.

3. The touch display panel of claim 2, wherein the touch substrate further comprises a planar layer on a side of the metal light blocking layer facing away the base substrate;
wherein the metal light blocking layer and the planar layer are adjacent to each other; and
the planar layer is between the metal light blocking layer and the plurality of metal traces.

4. The touch display panel of claim 1, wherein the touch substrate further comprises a touch control region, the touch control region comprises a plurality of first touch electrodes and a plurality of second touch electrodes intersecting but insulated from each other, each of the plurality of first touch electrodes comprises a plurality of first touch sub-electrodes, each of the plurality of second touch electrodes comprises a plurality of second touch sub-electrodes, each of the plurality of first touch sub-electrodes is directly connected to neighboring first touch sub-electrodes, each of the plurality of second touch sub-electrodes is connected to neighboring second touch sub-electrodes via a bridge, the plurality of first touch electrode is insulated from the plurality of second touch electrode by a plurality of insulating blocks.

5. The touch display panel of claim 4, wherein the touch substrate further comprises a planar layer on a side of the metal light blocking layer facing away the base substrate;
wherein the planar layer extends from the peripheral region into the touch control region by a length of around 10 μm to around 50 μm; and
the planar layer is on a same layer as the plurality of insulating blocks.

6. The touch display panel of claim 5, wherein the touch substrate further comprises a plurality of metal traces on a side of the planar layer facing away the base substrate, connected to the plurality of first touch electrodes and the plurality of second touch electrodes;
wherein the bridge is made of a metal material, and the plurality of metal traces are on a same layer as the bridge.

7. The touch display panel of claim 5, wherein the touch substrate further comprises a plurality of metal traces and a plurality of transparent electrode traces on a side of the planar layer facing away the base substrate;
wherein the bridge is made of a transparent material, and the plurality of transparent electrode traces are on a same layer as the bridge; and
the plurality of metal traces are on a different layer from the plurality of transparent electrode traces, each of the plurality of metal trace connects to each of the plurality of corresponding transparent electrode traces, the plurality of metal traces are connected to the plurality of first touch electrodes and the plurality of second touch electrodes via the plurality of corresponding transparent electrode traces.

8. The touch display panel of claim 1, wherein the metal light blocking layer comprises molybdenum or a molybdenum alloy.

9. The touch display panel of claim 8, wherein the metal light blocking layer comprises a molybdenum tantalum oxide alloy.

10. The touch display panel of claim 1, wherein the thickness of the metal light blocking layer is in the range of around 1000 Å to around 6000 Å.

11. The touch display panel of claim 10, wherein the thickness of the first light blocking layer is in the range of around 8 μm to around 18 μm.

12. A method of fabricating a touch display panel having a peripheral region, comprising forming a display panel and forming a touch substrate;
wherein forming the touch substrate comprises:
forming a first light blocking layer on a side of a base substrate facing the display panel and in the peripheral region of the touch substrate;
forming a metal light blocking layer on a side of the first light blocking layer facing away the base substrate and on a side of the first light blocking layer facing the display panel, and in the peripheral region; and
forming a plurality of metal traces on a side of the metal light blocking layer facing away the first light blocking layer and on a side of the metal light blocking layer facing the display panel, the plurality of metal traces formed to be respectively connected to a plurality of touch electrodes on the substrate;
wherein forming the display panel comprises assembling a first substrate and a second substrate facing each other, the first substrate being on a side of the second substrate facing away the touch substrate;
wherein the metal light blocking layer is formed on a side of the first light blocking layer facing the second substrate of the display panel; and
the plurality of metal traces are formed on a side of the metal light blocking layer facing the second substrate of the display panel.

13. The method of claim 12, wherein the metal light blocking layer is formed to comprises a molybdenum tantalum oxide alloy; and
forming the metal light blocking layer comprises forming a metal light blocking material layer comprising the molybdenum tantalum oxide alloy.

14. The method of claim 12, wherein forming the touch substrate further comprises:

forming a plurality of first touch electrodes and a plurality of second touch electrodes intersecting but insulated from each other on a touch control region of the base substrate; and forming a plurality of insulating blocks and a planar layer; wherein the planar layer is formed between the metal light blocking layer and the plurality of metal traces.

15. The method of claim 14, wherein each of the plurality of first touch electrodes is formed to comprise a plurality of first touch sub-electrodes, each of the plurality of second touch electrodes is formed to comprise a plurality of second touch sub-electrodes, each of the plurality of first touch sub-electrodes is formed to be directly connected to neighboring first touch sub-electrodes, each of the plurality of second touch sub-electrodes is formed to be not connected to neighboring second touch sub-electrodes; and wherein the plurality of insulating blocks are formed to be at positions where neighboring second touch sub-electrodes disconnect from each other so that the neighboring second touch sub-electrodes are spaced apart by the plurality of insulating blocks, the planar layer is formed to be in the peripheral region and extends into the touch control region by a predetermined length.

16. The method of claim 15, wherein the planar layer is formed in the peripheral region and is formed to extend into the touch control region by a length of around 10 µm to 50 µm.

17. The method of claim 15, wherein forming the touch substrate further comprises:

forming a plurality of bridges and a plurality of metal traces, wherein the plurality of bridges are formed on the plurality of insulating blocks, connecting the neighboring second touch sub-electrodes, the plurality of metal traces are formed on the planar layer, connected to the plurality of first touch electrodes and the plurality of second touch electrodes.

18. The method of claim 15, wherein forming the touch substrate further comprises:

forming a plurality of transparent bridges and a plurality of transparent electrode traces, wherein the plurality of transparent bridges are formed on the plurality of insulating blocks, connecting the neighboring second touch sub-electrodes, the plurality of transparent electrode traces are formed on the planar layer, connected to the plurality of first touch electrodes and the plurality of second touch electrodes; and forming a plurality of metal trace in the peripheral region, wherein each of the plurality of metal trace corresponds to and is formed to be connected to each of the plurality of transparent electrode traces.

19. The method of claim 13, wherein forming the metal light blocking layer comprises sputtering molybdenum and tantalum in an argon atmosphere and oxidizing molybdenum and tantalum with an oxygen-containing gas to form a molybdenum tantalum oxide thin film, wherein the molar ratio of argon and oxygen is in the range of 1:9 to 2:8.

* * * * *